(12) United States Patent
Viviani

(10) Patent No.: US 10,892,709 B1
(45) Date of Patent: Jan. 12, 2021

(54) ELECTRONIC PRECISION TIMING DEVICE

(71) Applicant: BAE Systems Information and Electronic System Integration Inc., Nashua, NH (US)

(72) Inventor: Gary L. Viviani, Bastrop, TX (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/579,992

(22) Filed: Sep. 24, 2019

(51) Int. Cl.
   *H03B 5/12* (2006.01)
   *H03B 7/06* (2006.01)

(52) U.S. Cl.
   CPC .............. *H03B 5/1225* (2013.01); *H03B 5/12* (2013.01); *H03B 7/06* (2013.01)

(58) Field of Classification Search
   CPC ... H03B 5/08; H03B 5/10; H03B 5/12; H03B 7/02; H03B 7/04; H03B 7/06; H03B 5/1225
   See application file for complete search history.

(56) References Cited

U.S. PATENT DOCUMENTS

| 7,042,301 | B2 | 5/2006 | Sutardja | |
| 7,795,983 | B1* | 9/2010 | Delaney | H03B 29/00 |
| | | | | 331/117 R |
| 9,240,792 | B2* | 1/2016 | McCorquodale | H03B 5/04 |
| 10,153,729 | B2* | 12/2018 | Kumar | H03B 7/06 |

OTHER PUBLICATIONS

Viviani, G. L. "On synthesis and design of multi-stable devices." 1988., IEEE International Symposium on Circuits and Systems. IEEE, 1988. (Year: 1988).*
Viviani, Gary L. "Forced 2-D Energy Transitions Suitable for High Power Applications." IEEE Transactions on Plasma Science 47.7 (2019): 3228-3240. (Year: 2019).*

* cited by examiner

*Primary Examiner* — Ryan Johnson
(74) *Attorney, Agent, or Firm* — Sand, Sebolt & Wernow LPA; Scott J. Asmus

(57) ABSTRACT

A synthetic crystal oscillator enables a conventional crystal to be replaced with purely active electronic elements. Stability and performance characteristics are shown to be comparable-to-superior to a conventional crystal oscillator with side-by-side simulations. The synthetic crystal oscillator with purely active electronic elements offers cost, miniaturization and performance benefits. In some examples, the purely active electronic elements include an RLC circuit generate multiple stable concentric oscillations associated with nonlinear resonance used as an oscillator without a conventional crystalline structure coupled to the electrical circuit.

13 Claims, 14 Drawing Sheets

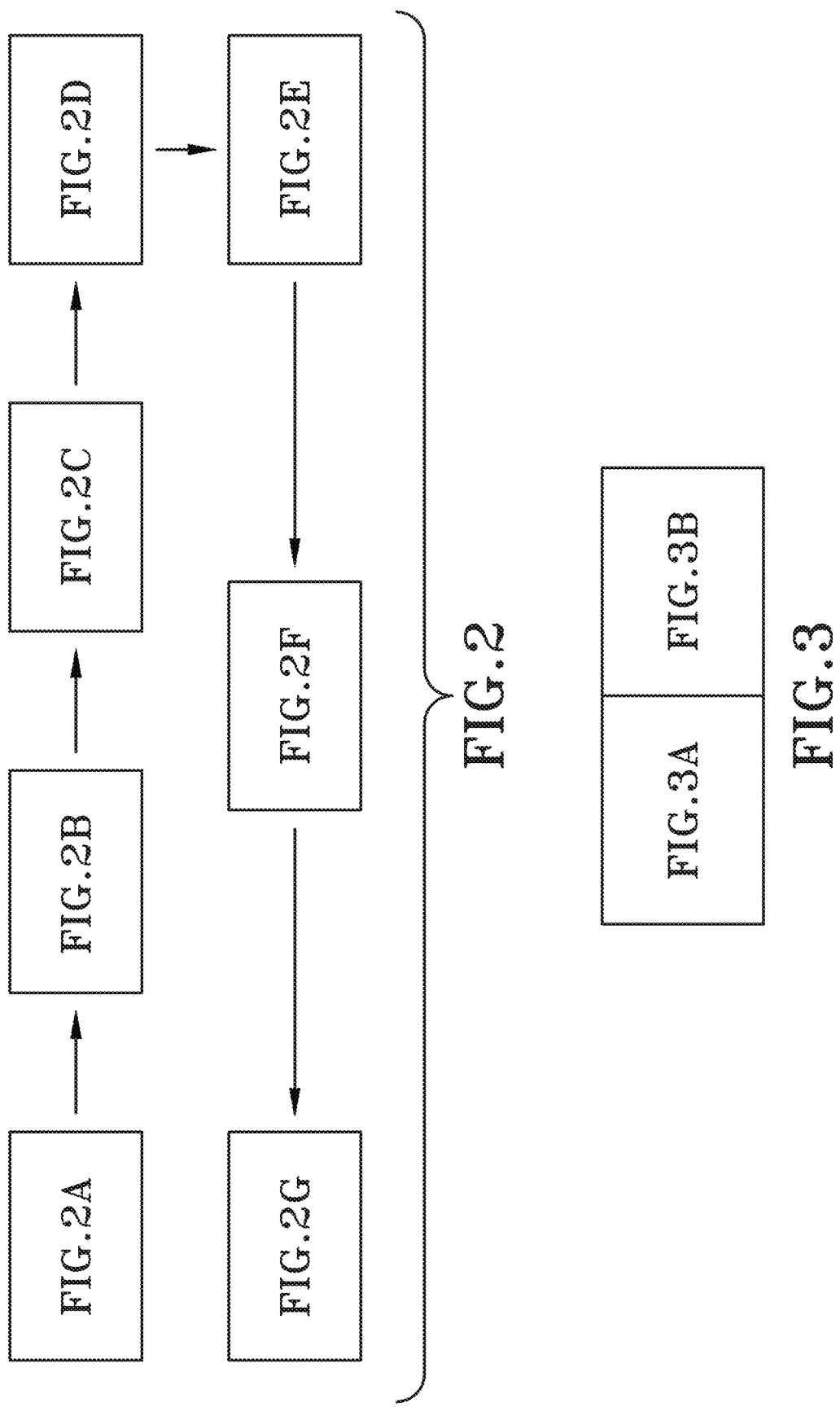

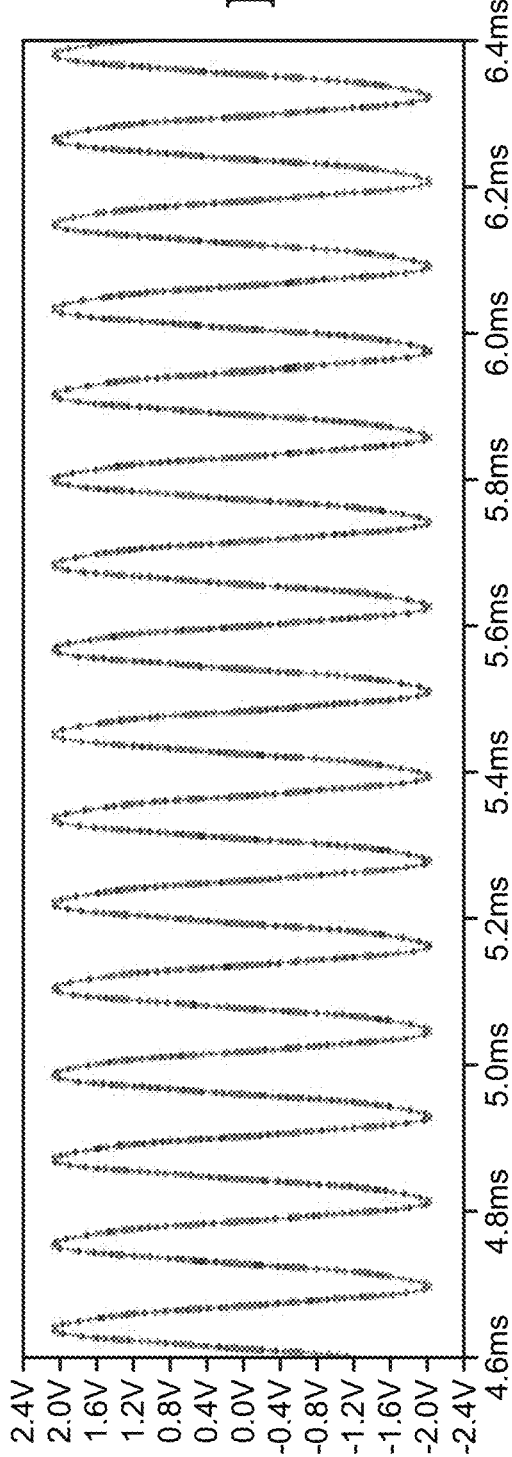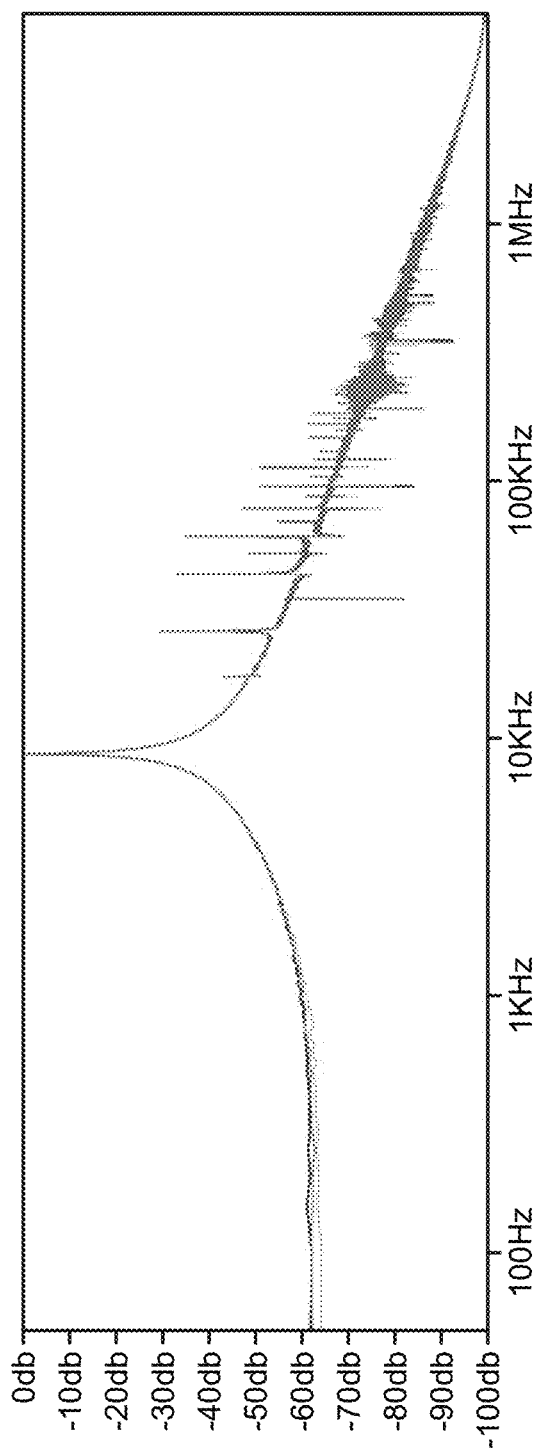

ELECTRONIC PRECISION TIMING DEVICE

TECHNICAL FIELD

The present disclosure relates generally to an electronic precision timing device. More particularly, the present disclosure relates to an integrated circuit synthetic oscillator. Specifically, the present disclosure provides an integrated circuit that functions as well as a conventional crystal oscillator but solely with electrical components and without any crystal or crystalline structure.

BACKGROUND

Oscillator circuits or oscillators are some of the core components of modern electronics. Most digital electronics for accurate precision measurement require precision timing, which is often dependent upon a crystal oscillator. Even for a crystal oscillator, the associated electronics (in particular the transistor(s)) are subject to variations in performance based on temperature as well as other factors. Various environmental factors also effect the crystal itself. In this analysis, the crystal is considered to be ideal.

Since crystal oscillators require some associated electronics, the performance of a crystal oscillator is governed by both electronic variability, as well as the variability associated within the crystal itself. In addition, for the case of a crystal oscillator, it must be bonded to the electronics. This is required since a crystal is not manufactured with standard semiconductor processing steps; it must somehow be accommodated by an alternative approach. This alternative approach is prone to greater variability than the inherent semiconductor process itself. Stated otherwise, manufacturing the connection of a conventional crystalline oscillator to the other portions of the oscillator circuit can introduce irregularities and variances that affect the oscillator's performance.

SUMMARY

Issues continue to exist with conventional crystalline-based oscillators since the crystalline structure is not integrally formed with the remaining electronic circuitry on a single chip. The present disclosure addresses this issue by providing a semiconductor-only oscillator that is homogeneous. This homogeny means that the semiconductor-only does not require a secondary approach to bond the crystal to the semiconductor device. This has inherent cost, process, size and likely performance advantages. Further, even if performance of a purely electronic oscillator was only equal to that of a conventional crystal based oscillator, for cost, process, and size considerations, the semiconductor-only oscillator would be considered advantageous.

In one aspect, an exemplary embodiment of the present disclosure provides an integrated circuit synthetic oscillator comprising: an electrical circuit; and nonlinear feedback generated by the electrical circuit that generates multiple stable (invariant) oscillations; wherein one of the stable (invariant) oscillations is employed in a timing circuit for precision measurement in a digital device without a crystalline structure coupled to the electrical circuit. This exemplary embodiment or another exemplary embodiment may further include a voltage source coupled to the electrical circuit; wherein voltage applied to the electrical circuit generates the nonlinear feedback to the multiple stable (invariant) oscillations comprising a stable inner oscillation, a stable (invariant) middle oscillation, and a stable (invariant) outer oscillation. This exemplary embodiment or another exemplary embodiment may further include wherein the stable middle oscillation is bound between the stable inner oscillation and the stable outer oscillation. This exemplary embodiment or another exemplary embodiment may further include wherein the nonlinear feedback is a nonlinearity having at least 5 distinct regions with a negative slope adapted to correspond an electrically powered event that results in at least three stable oscillations. This exemplary embodiment or another exemplary embodiment may further include a voltage source generating the at least 5 distinct regions with the negative slope in the nonlinearity. This exemplary embodiment or another exemplary embodiment may further include a constrained oscillation that is bound by inner and outer oscillations, wherein the constrained oscillation is adapted to reduce drift. This exemplary embodiment or another exemplary embodiment may further include at least two transistors in the electrical circuit carried that generate a negative resistance in response to the voltages sources contained within the electrical circuit, wherein the nonlinear feedback is based, at least in part, on the negative resistance.

In another aspect, an exemplary embodiment of the present disclosure provides an integrated circuit synthetic oscillator comprising: an electrical circuit; and nonlinear feedback generated by the electrical circuit that generates multiple stable oscillations; wherein one of the stable oscillations is employed in a timing circuit for precision measurement in a digital device without a crystalline structure coupled to the electrical circuit. This exemplary embodiment or another exemplary embodiment may further provide a current source contained within the electrical circuit to define a current controlled nonlinear circuit; wherein the current controlled nonlinear circuit generates the nonlinear feedback to the multiple stable oscillations comprising a stable inner oscillation, a stable middle oscillation, and a stable outer oscillation when combined with an inductor and capacitor. This exemplary embodiment or another exemplary embodiment may further provide wherein the stable middle oscillation is bound between the stable inner oscillation and the stable outer oscillation. This exemplary embodiment or another exemplary embodiment may further provide a voltage source contained within the electrical circuit to define a voltage controlled nonlinear circuit; wherein the voltage controlled nonlinear circuit generates the nonlinear feedback to the multiple stable oscillations comprising a stable inner oscillation, a stable middle oscillation, and a stable outer oscillation when combined with a parallel inductor and capacitor. This exemplary embodiment or another exemplary embodiment may further provide wherein the stable middle oscillation is bound between the stable inner oscillation and the stable outer oscillation. This exemplary embodiment or another exemplary embodiment may further provide wherein the nonlinear feedback is a nonlinearity having at least 5 distinct regions with a negative slope adapted to correspond an electrically powered event that results in at least three stable oscillations. This exemplary embodiment or another exemplary embodiment may further provide a voltage (current) source generating the at least 5 distinct regions with the negative slope in the nonlinearity. This exemplary embodiment or another exemplary embodiment may further provide a constrained oscillation that is bound by inner and outer oscillations, wherein the constrained oscillation is adapted to reduce drift. This exemplary embodiment or another exemplary embodiment may further provide at least two transistors in the electrical circuit carried that generate a negative resistance in response to the voltage applied to the electrical circuit, wherein the nonlinear feedback is based, at least in part, on the negative resistance.

In another aspect, an exemplary embodiment of the present disclosure provides a method comprising: voltage(s) source(s) contained in an integrated circuit; generating nonlinear feedback; generating multiple stable oscillations or limit cycles based on the nonlinear feedback; and connecting at least one of the stable (invariant) oscillations or limit cycles to a timing circuit for precision time measurement in a digital device that electronically functions as well as a crystal oscillator. This exemplary embodiment or another exemplary embodiment may further include synchronizing the digital device with a second digital device based on the timing circuit connected to the at least one stable (invariant) oscillation or limit cycle. This exemplary embodiment or another exemplary embodiment may further include wherein the electrical circuit is free from any connection to a crystalline structure. This exemplary embodiment or another exemplary embodiment may further include generating at least three stable (invariant) oscillations or limit cycles based on the nonlinear feedback. This exemplary embodiment or another exemplary embodiment may further include wherein the at least three stable (invariant) oscillations or limit cycles are concentric. This exemplary embodiment or another exemplary embodiment may further include wherein at least three oscillations or limit cycles include an inner, a middle, and an outer stable oscillation or limit cycle, further comprising: bounding the middle stable oscillation or limit cycle between the inner and outer stable oscillations or limit cycles.

In yet another aspect, an exemplary embodiment of the present disclosure provides a method comprising: creating a particular nonlinearity based on a voltage or current in an integrated circuit; a multiple limit cycle generating nonlinearity for feedback in response to the voltage or current; generating multiple stable oscillations or limit cycles based on the nonlinear feedback; and connecting at least one of the stable oscillations or limit cycles to a timing circuit for precision time measurement in a digital device that electronically simulates or emulates a crystal oscillator. This exemplary method or another exemplary method may further provide synchronizing the digital device with a second digital device based on the timing circuit connected to the at least one stable oscillation or limit cycle. This exemplary method or another exemplary method may further provide wherein the electrical circuit free from any connection a crystalline structure. This exemplary method or another exemplary method may further provide generating at least three oscillations or limit cycles based on the nonlinearity with a governing equation defined by Theorem 3. This exemplary method or another exemplary method may further provide wherein the at least three oscillations or limit cycles are concentric. This exemplary method or another exemplary method may further provide wherein at least three oscillations or limit cycles include an inner, a middle, and an outer stable oscillation or limit cycle, further comprising: bounding the middle stable oscillation or limit cycle between the inner and outer stable oscillations or limit cycles.

In yet another aspect, an exemplary embodiment of the present disclosure may provide a synthetic crystal oscillator enables a conventional crystal to be replaced with purely active electronic elements. Stability and performance characteristics are shown to be comparable-to-superior to a conventional crystal oscillator with side-by-side simulations. The synthetic crystal oscillator with purely active electronic elements offers cost, miniaturization and performance benefits. In some examples, the purely active electronic elements include an RLC circuit to generate multiple stable concentric oscillations associated with nonlinear resonance used as an oscillator without a conventional crystalline structure coupled to the electrical circuit.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

FIG. 2 is a diagrammatic view collectively depicting FIG. 2A, FIG. 2B, FIG. 2C, FIG. 2D, FIG. 2E, FIG. 2F and FIG. 2G.

FIG. 3 is a schematic view indicating that FIG. 3A and FIG. 3B are to be viewed collectively.

FIG. 8A is a graph depicting an operational amplifier oscillator time domain results for four temperatures.

FIG. 8B is a graph depicting an operational amplifier frequency domain results (FFT) for four temperatures.

Similar numbers refer to similar parts throughout the drawings.

DETAILED DESCRIPTION

Figure 1:
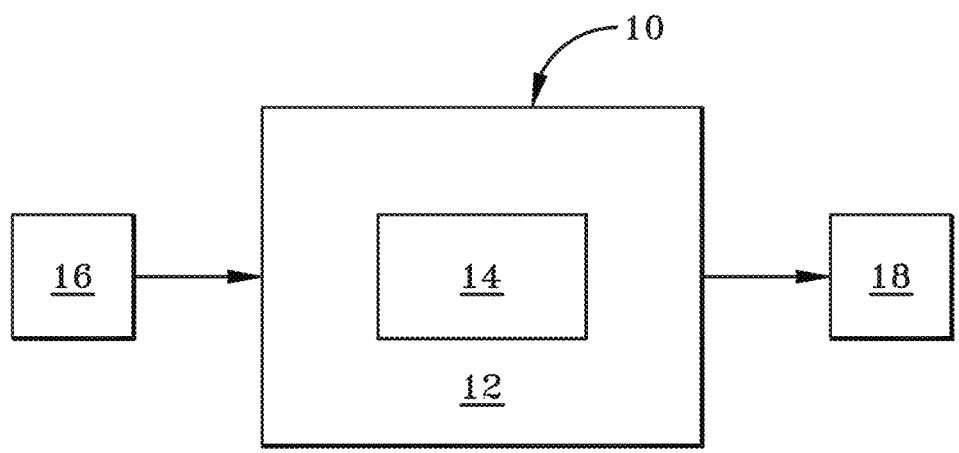
FIG. 1 is a diagrammatic view of an electronic precision timing device in accordance with one aspect of the present disclosure.

FIG. 1 diagrammatically depicts a synthetic crystal oscillator in accordance with one aspect of the present disclosure, generally at 10. The synthetic crystal oscillator 10 is an integrated circuit having a substrate 12 carrying electronic circuitry 14 that is integrally formed therewith during production of the integrated circuit. As we described in greater detail herein, the electronic circuitry 14 is purely semiconductor components that are configured to emulate, simulate, or otherwise synthetically function as an oscillator but enable the synthetic oscillator 10 to be free of any connections to a conventional crystal oscillator or crystalline structure. Oscillator 10 is coupled with an input 16 that is electrically connected with the electronic circuitry 14. Further, oscillator 10 is coupled with an output 18 that is configured to be connected with a downstream electrical component using the oscillations in a manner that would typically need digital (or else analog transistor logic (TTL)) oscillation functions, such as clock or timing requirements. In one example, output 18 is coupled with a timing circuit for precision measurements in an electrical device. The integrated circuit of the synthetic oscillator 10 may be used in a variety of electronic components. However, it is contemplated at one electrical component that may be used for timing functions when, for example, GPS signal based timing is unavailable.

With electronic oscillators, they typically drift or have a tendency to drift, during their operation. The synthetic crystal oscillator 10 of the present disclosure provides a stable or invariant implementation for a purely electronic oscillator that significantly reduces the likelihood of the oscillator to drift or does not drift at all during its operation. Recall that conventionally, a crystal element is utilized in order to reduce the likelihood that an oscillator will drift. The drifts may be related to temperature, related environmental effects or voltage related drifts. If there is a purely electronic oscillator that does not use a crystal, then a purely electronic oscillator will have a tendency to drift or change under a variety of conditions absent to additional constraints. In accordance with one aspect of the present disclosure, synthetic crystal oscillator 10 is purely electronic and does not require a crystalline structure, but has a tendency not to drift.

Synthetic crystal oscillator 10 of the present disclosure has nonlinear feedback generating multiple stable (i.e., invariant) oscillations or limit cycles that causes the middle oscillation to be extremely stable. The nonlinear feedback is created by a complex nonlinear equation or nonlinearity. The complex nonlinearity results in an outside stable oscillation or limit cycle and an inside stable oscillation or limit cycle. The outside stable limit cycle/oscillation and the inside stable limit cycle/oscillation create barriers or boundaries for the middle oscillation or limit cycle. The middle oscillation or limit cycle is able to be utilized as a stable oscillator that replaces conventional crystalline structures or a crystal. Stated otherwise, the middle stable oscillation or limit cycle is constrained from its ability to deviate from whatever the desired oscillation state is. The shape of the nonlinearity therefore creates boundaries that limit the middle stable oscillation or limit cycle so that it may be effectively utilized as a synthetic crystal.

The feedback is generated by the complex nonlinear equation. The term complex nonlinear equation of the present disclosure refers to nonlinear equation that generates more than one limit cycle. As is known by conventional van der Pol oscillators, the nonlinear equation resulting from a van der Pol oscillator has a single negative slope which generates one limit cycle. In accordance with the present disclosure, a complex nonlinearity is utilized having multiple negative slopes which results in multiple limit cycles through the use of only a single equation.

Figure 2A:
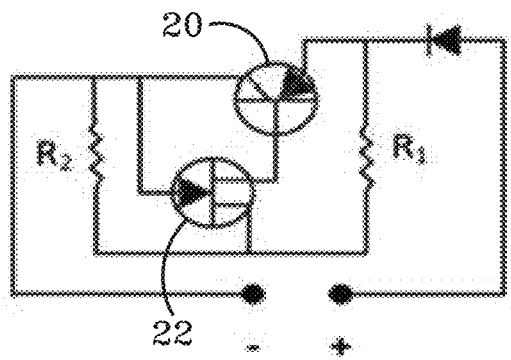
FIG. 2A is a schematic circuit having two transistors in accordance with the present disclosure.
Figure 2B:
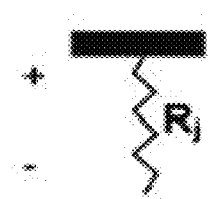
FIG. 2B is a pictorial representation of the circuit of FIG. 2A.
Figure 2C:
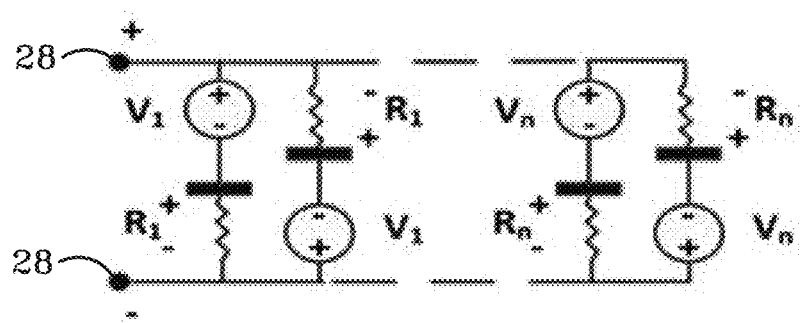
FIG. 2C is a schematic view of a circuit having a parallel combination of devices identified in FIG. 2B.
Figure 2D:
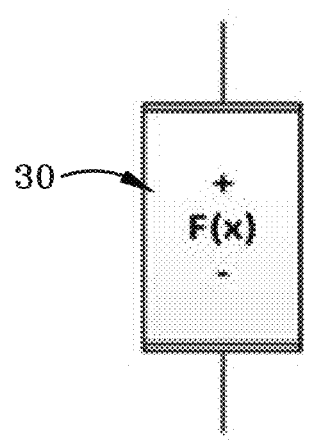
FIG. 2D is a diagrammatic view of a resultant device embodied from the schematic of FIG. 2C.
Figure 2E:
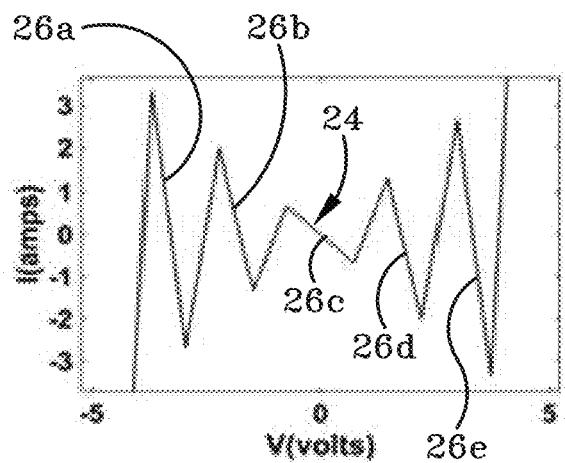
FIG. 2E is a graph depicting a typical resultant I-V (current-voltage) phase plane characteristic.
Figure 2F:
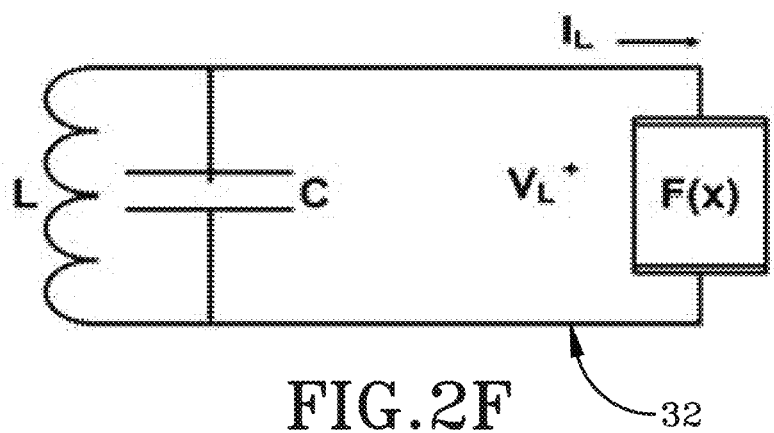
FIG. 2F depicts a resonant circuit combining the device of FIG. 2D with a capacitor and an inductor.
Figure 2G:
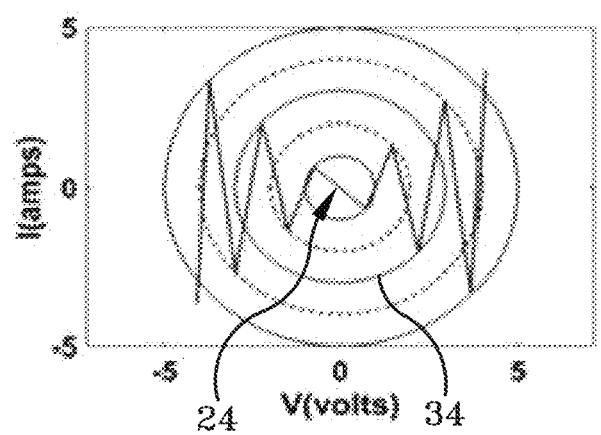
FIG. 2G is a graphical representation indicating the superposition between the I-V characteristic of FIG. 2E and the associated stable and unstable oscillations.

FIG. 2A indicates one method for creating a negative resistance building block based on two transistors 20, 22. FIG. 2B is a pictorial representation of FIG. 2A. FIG. 2C is a parallel combination many devices of type FIG. 2B along with DC voltage potentials 28. FIG. 2D a resultant device 30 symbol represented by F(x). FIG. 2E is a typical resultant I-V (current-voltage) phase plane characteristic of the nonlinearity 24. FIG. 2F indicates the resonant circuit 32 which combines a single device 30 FIG. 2E with a suitable capacitor C and inductor L—a nonlinear "R"LC circuit. FIG. 2G indicates the superposition between the I-V characteristic and the associated phase plane autonomous stable (solid line) and unstable (dashed line) oscillations.

As a consequence of Green's Theorem, stable (i.e., invariant) and unstable oscillations must be concentric, in the phase (I-V) plane. NOTE: For the case of FIG. 2E and FIG. 2G a device which corresponds to 3 stable and 2 unstable limit cycles (periodic orbits) is shown. This is arbitrarily chosen. The shape of the nonlinearity 24 in FIG. 2E can be designed for an arbitrary number of limit cycles with the constraint the they are concentric and that they alternate between stable and unstable ones.

As depicted in FIG. 2A through FIG. 2G, and as referenced herein, oscillator 10 includes a capacitor C, a resistor R (which is represented by F(x) of device 30) and an inductor L which results in a more complicated nonlinearity. Additionally, there are two transistor elements 20, 22 that are associated with making curves that look like the nonlinearity identified in FIG. 2E. The result and shape of the complex nonlinearity is multiple limit cycles or oscillations. Additionally, the complex nonlinearity results in concentric limit cycles or oscillations. In one particular embodiment, three concentric oscillations or limit cycles are provided in which the middle limit cycle is bounded by the inside limit cycle and the outside limit cycle. The next effect is that the outside limit cycle and the inside limit cycle are forcing middle limit cycle to be ultra-stable. Since the middle limit cycle or oscillation is bounded, it produces very little jitter or drift when the middle limit cycle or oscillation is utilized and subjected to a variety of conditions. The inside limit cycle or oscillation and the outside limit cycle or oscillation may be considered to be electronic forces that bound and stabilize the concentric middle limit cycle or oscillation.

Oscillator 10 utilizes voltages. Without loss of generality, a current controlled circuit could also be used to create a nonlinearity that is dependent upon current, instead of voltage. In the case of a current controlled nonlinearity the resultant system would involve a nonlinearity (F(i), in series with a C (capacitor) and L (inductor)). Assuming a voltage control device, voltages are utilized to create the complex nonlinearity. For example, as depicted in FIG. 2(e), the complex nonlinearity 24 is graphed in which the vertical Y axis represents current and the horizontal X axis represents voltage. The negative slope portions 26a, 26b, 26c, 26d, 26e of the graph of FIG. 2E requires energy as it is an unnatural state. Stated otherwise, a negative slope does not occur without energy being put into the circuit. In order to create the nonlinearity 24 (a the negative slope portions 26a, 26b, 26c, 26d, 26e), which in this particular example there are five sections of negative slope, this requires there to be five active elements that translate into three stable (i.e., invariant) cycles or oscillations and two unstable (i.e., invariant) cycles. Within each active element, there are voltage sources and transistors, the circuits of which are identified in FIG. 3 and FIG. 4. The present disclosure substitutes a complex nonlinearity for a relatively simple nonlinearity of a conventional van der pol Oscillator. The oscillations of the outer limit cycle and the inner limit cycle constrain the middle oscillation or limit cycle. In some instances, these may be design parameters in which an operator can force the parameters to make the stability zone of the middle stable oscillator as tight as desired. In the case of a single oscillator or limit cycle, there is nothing to force the oscillation or limit cycle to be bounded. Thus, if there are variations in the components, it will drift around and change shape and possible change frequency. There is nothing to prevent a single limit cycle or single oscillation from being bounded. In the present disclosure, inner and outer limit cycles electronically enclose the middle limit cycle or oscillation so that it is extremely stable. Thus, the present disclosure artificially creates an electronic narrow path in which the middle stable oscillation or limit cycle must remain.

In one particular embodiment, since there are multiple limit cycles in the phase plane, then they alternate in magnitude between stable and unstable. In this particular embodiment, the boundary of the middle stable limit cycle or oscillation is surrounded by two unstable limit cycles or oscillations. Then, the only way to generate two unstable limit cycles that surround the middle stable limit cycle or oscillation is to create two more stable limit cycles or oscillations. It is the only way to have a central limit cycle as bounded is to create three total stable limit cycles. Thus the five negative slope portions 26a, 26b, 26c, 26d, 26e of the complex nonlinearity 24 identified in FIG. 2E corresponds to the inner stable limit cycle, the inner unstable limit cycle, the middle stable limit cycle, the outer unstable limit cycle, and the outer stable limit cycle, respectively. An unstable limit cycle refers to a limit cycle or oscillation that is stable when using negative time. Thus, a stable limit cycle or oscillation is mathematically unstable when input with negative time. Stated otherwise, if one reverses time then the stable limit cycle becomes unstable and the unstable limit cycle becomes stable.

Synthetic oscillator 10 and its various components will be described in greater detail below with reference to the remaining figures. Its operational advantages can be seen in the various examples and performance simulations.

The results to be presented are based on a multi-stable device circuit as described by FIG. 2. A particular type of phase plane nonlinearity 24, that need not be piecewise linear (see FIG. 2D-FIG. 2E), if placed in parallel with suitable inductors, L's, and capacitors, C's, it gives rise to multiple stable oscillations, each with a particular zone of attraction that is bounded by unstable oscillations. This is illustrated in FIG. 2G.

As compared with the orbitals of an atom, the ones represented by FIG. 2G cannot be simultaneously active. In a conventional atom, each orbital can be approximated as representing one or more particles in a specific periodic orbit with an associated wave equation. By comparison, the orbits of FIG. 2G can be thought of as being active, one at a time, and the associated oscillation will remain in a particular orbit, subject only to changes in initial conditions. As the domains of attraction for this particular oscillation are concentric in the phase plane, an initial condition that causes a change in the domain of attraction (orbital change) must also constitute a change in energy. Clearly each orbital corresponds to a different (average) energy. In this regard, the orbitals (stable limit cycles) of FIG. 2G can be thought of as representing the energy of a particular particle that is subject to changing orbitals based on changes in energy conditions. (Changes that do not exceed a quantized threshold will not result in a change in orbitals.) This is consistent with a particle being in one of several quantized states. This is the basis of a multi-stable oscillator. NOTE: The pertinent and most important characteristic of a multi-stable oscillator 10 is the governing nonlinearity 24, F(x) of device 30, of FIG. 2E.

For what follows, the present disclosure will only consider the middle stable orbital, i.e., the middle stable oscillation 34, as illustrated in FIG. 2G will be compared to the single stable oscillation of a crystal oscillator. Going forward, two sorts of multi-stable device fabrication methods will be considered, as follows: Case A: FIG. 2 illustrates the creation of a nonlinear element device 30, F(x), based on parallel components which are comprised of two transistors 20, 22 and a voltage source 28 in multiple parallel branches. The result is seen as an I-V characteristic shown in FIG. 2E; and Case B: the I-V nonlinearity can be synthesized by more than one manner, such as with an OPAMP (Operational Amplifier).

It is important to observe that a simple circuit as illustrated in FIG. 2F, with a suitable nonlinearity 24 as illustrated in FIG. 2E, will oscillate. The fact that there is more than one oscillation can be ignored, except to note that the presence of the outer most one, as well as the inner most one, will create a situation that the middle oscillation 34 (the one the present disclosure is considering) is even more stable and precise than it otherwise might be. The Lyapunov Exponents that are associated with the rate of convergence to a stable limit cycle (for a multi-stable device) can be made arbitrarily large, which means the rate of convergence is arbitrarily fast. Such a capability does not exist in conventional oscillator design and implementation. There are also boundaries on the zones of stability, which can be made as small as desired for any nonlinearity.

Two Different Multi-stable Oscillators: Case A and Case B implementation of multi-stable oscillators will be described. In each case, there is a possibility of 3 (different) stable oscillations, but in each case only the middle stable oscillation will be considered and it will be compared to the (single) stable oscillation of a conventional crystal oscillator circuit.

Figure 3A:
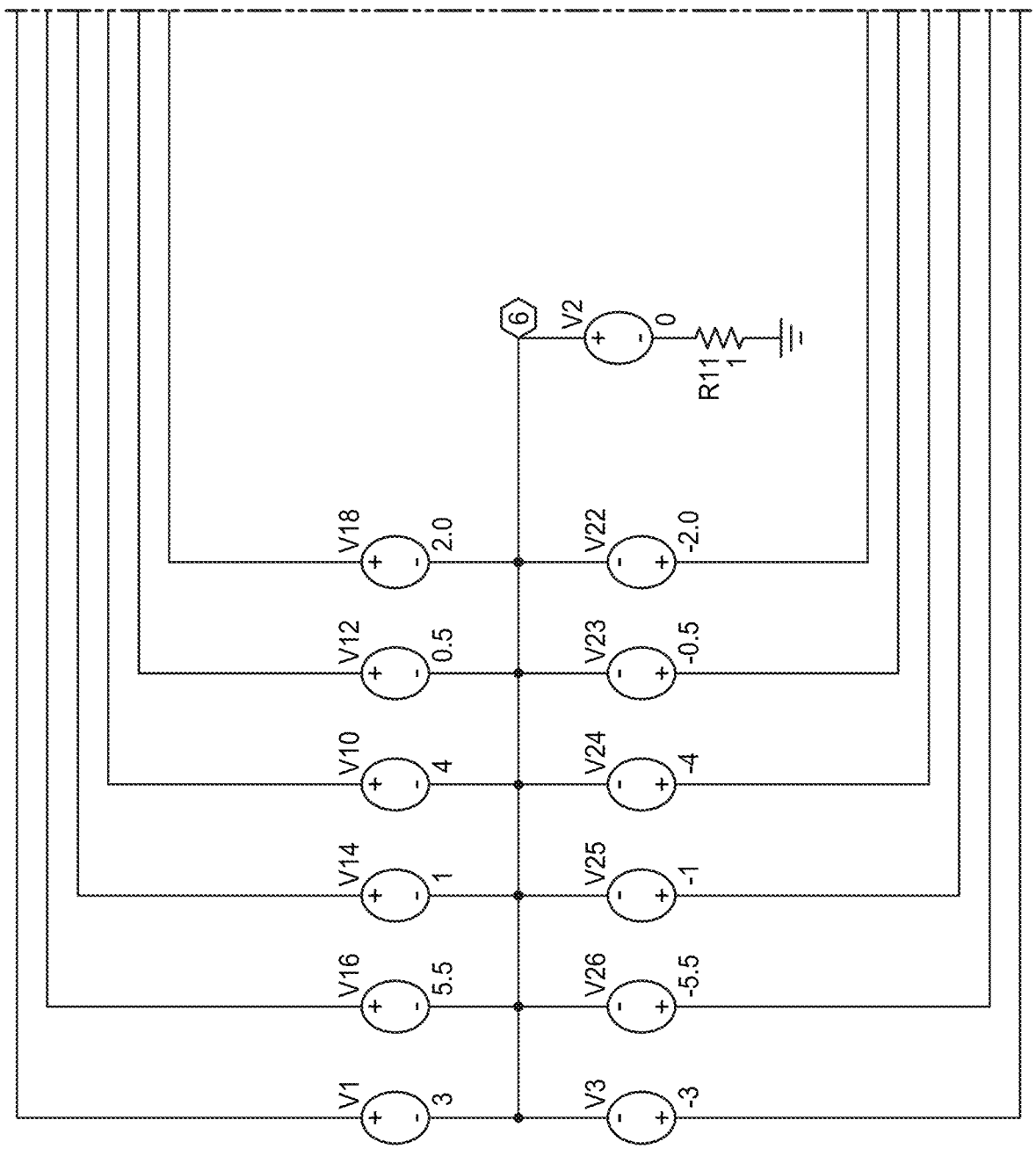
FIG. 3A is a schematic view for a synthetic crystal oscillator.
Figure 3B:
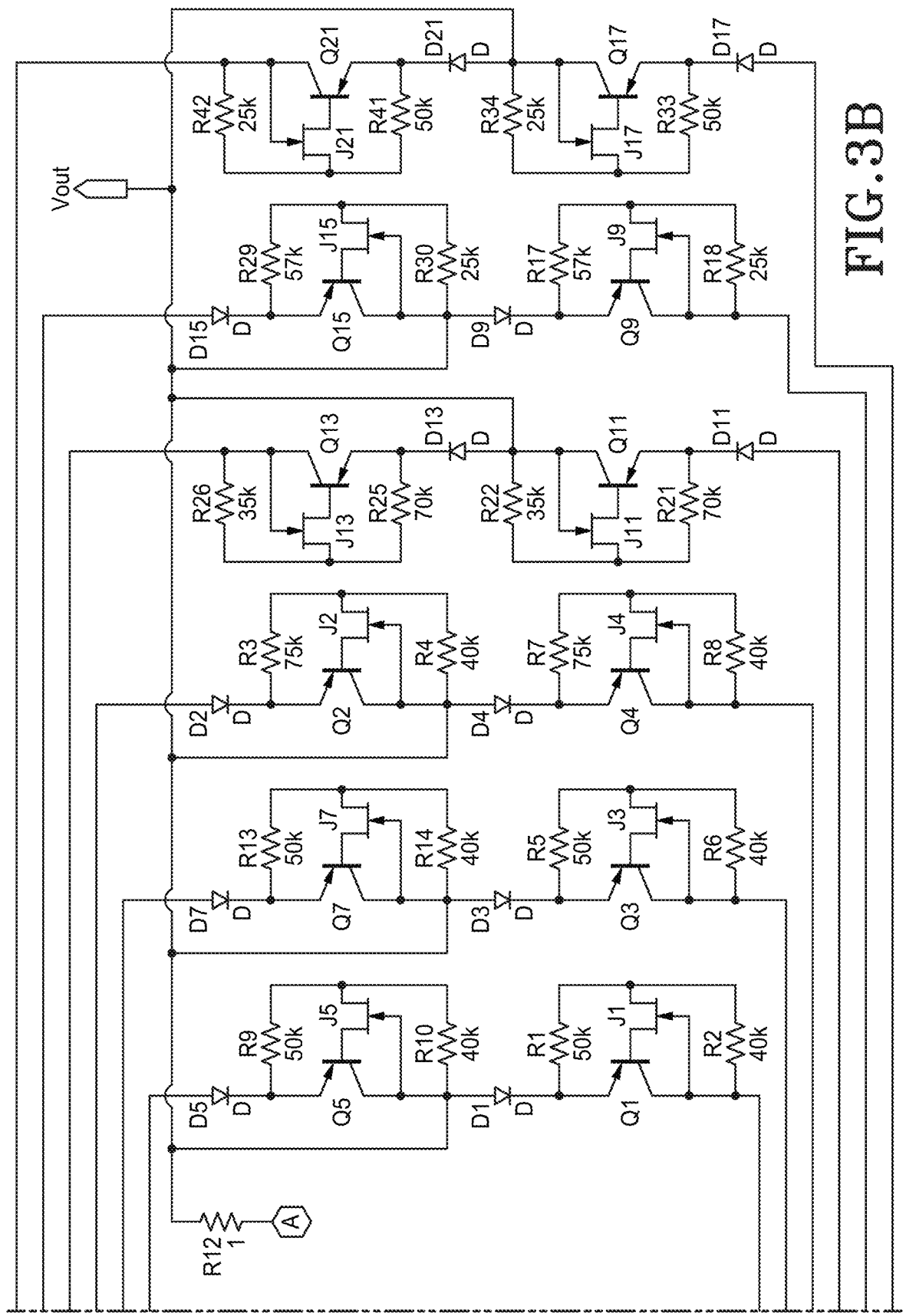
FIG. 3B is the other half of the schematic view of the synthetic crystal oscillator of FIG. 3A.
Figure 4:
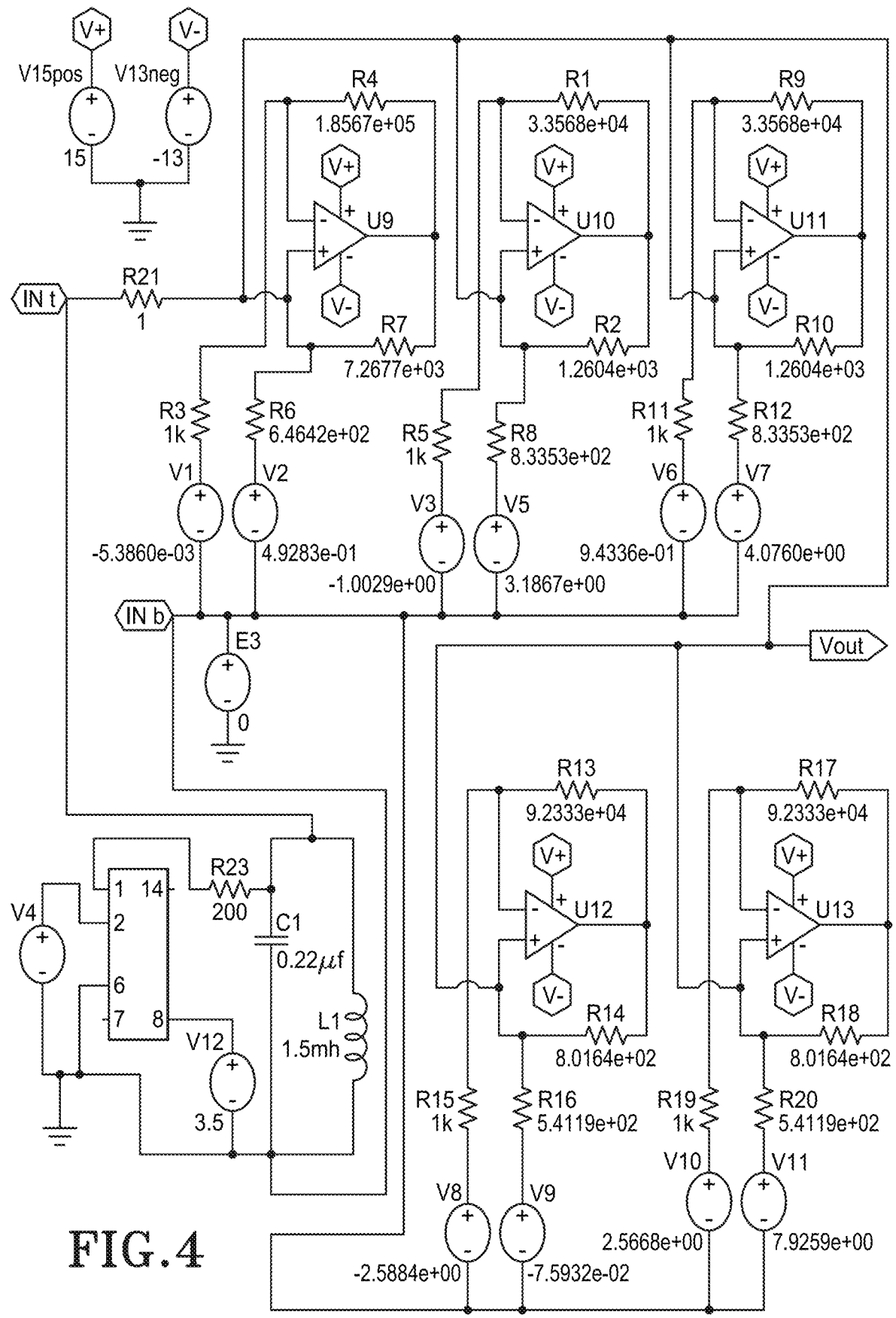
FIG. 4 is a schematic view of a synthetic oscillator using an operational amplifier.

FIG. 3 is a diagram indicating that FIG. 3A and FIG. 3B should be viewed together. FIG. 3A and FIG. 3B is a Case A oscillator for SPICE simulation where the nonlinearity 24 is created consistent with FIG. 2. FIG. 4 is a Case B oscillator for SPICE simulation where the nonlinearity is created consistent with FIG. 2.

Simulation Results

The simulations for the circuits of a conventional crystal oscillator, FIG. 3 and FIG. 4 (conducted in an identical manner) are now compared.

Figure 5:
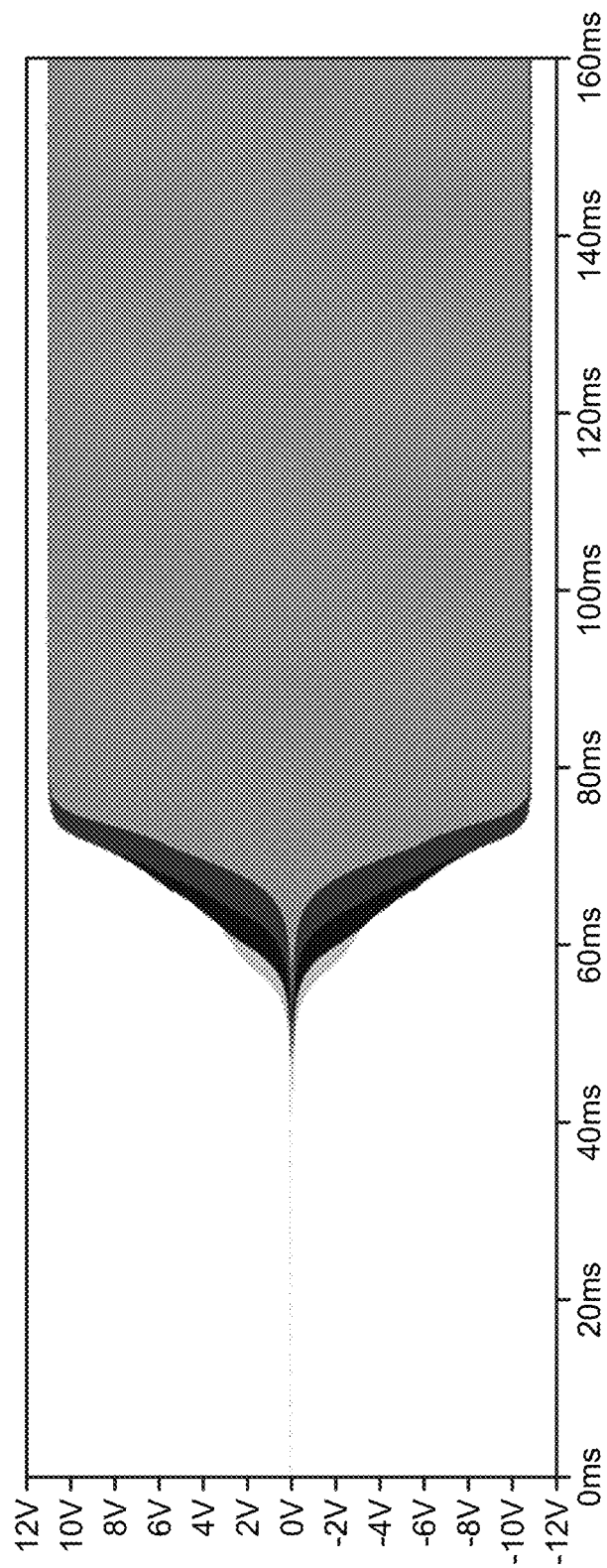
FIG. 5 is a graph depicting a crystal oscillator start-up transients.

Conventional Crystal Oscillator Details: As is characteristic of crystal oscillators, the startup transients are significant. They are indicated in FIG. 5. In what follows, all simulations were performed 4 times, for each circuit, in order to model temperature effects at 0, 25, 50 and 75 degrees Celsius. This is illustrated by shaded regions. More particularly, FIG. 5 depicts the crystal oscillator startup transients: An approximately 1 MHz conventional crystal oscillator is transitioning from startup to stable oscillations. Only the envelope of the superimposed oscillations is visible. The individual traces correspond to 0, 25, 50 and 75 deg C. which are overlaid according to the sequence of shaded regions. In particular, there is variability, based solely on temperature.

Figure 6A:
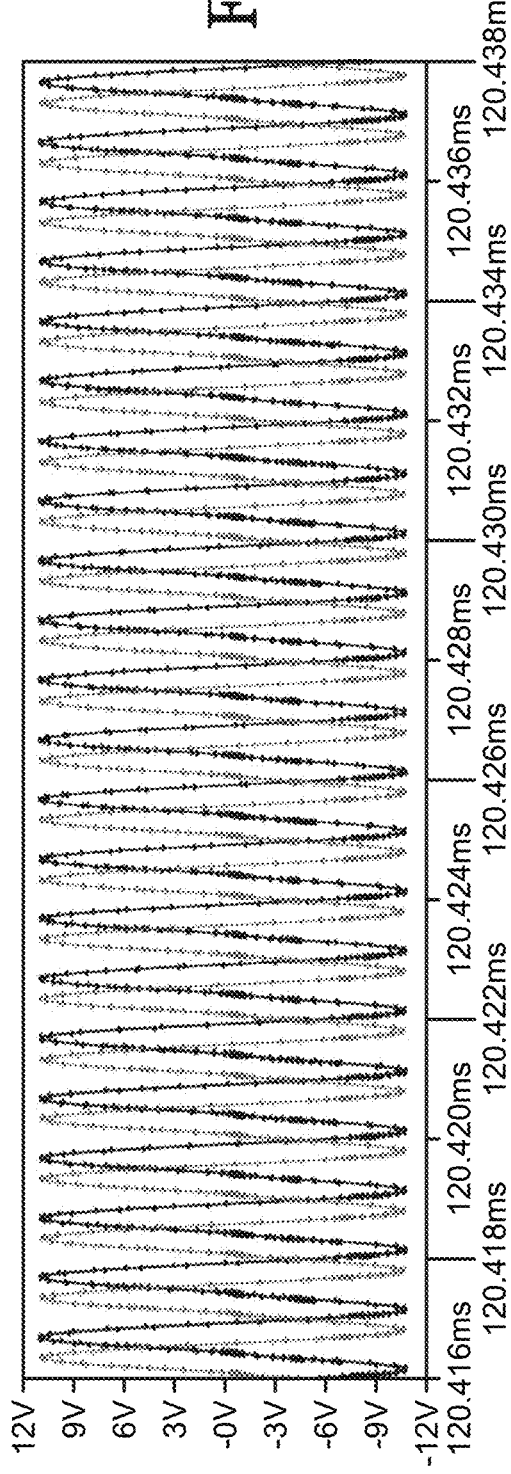
FIG. 6A is a graph depicting a conventional crystal oscillator time domain results for four temperatures.
Figure 6B:
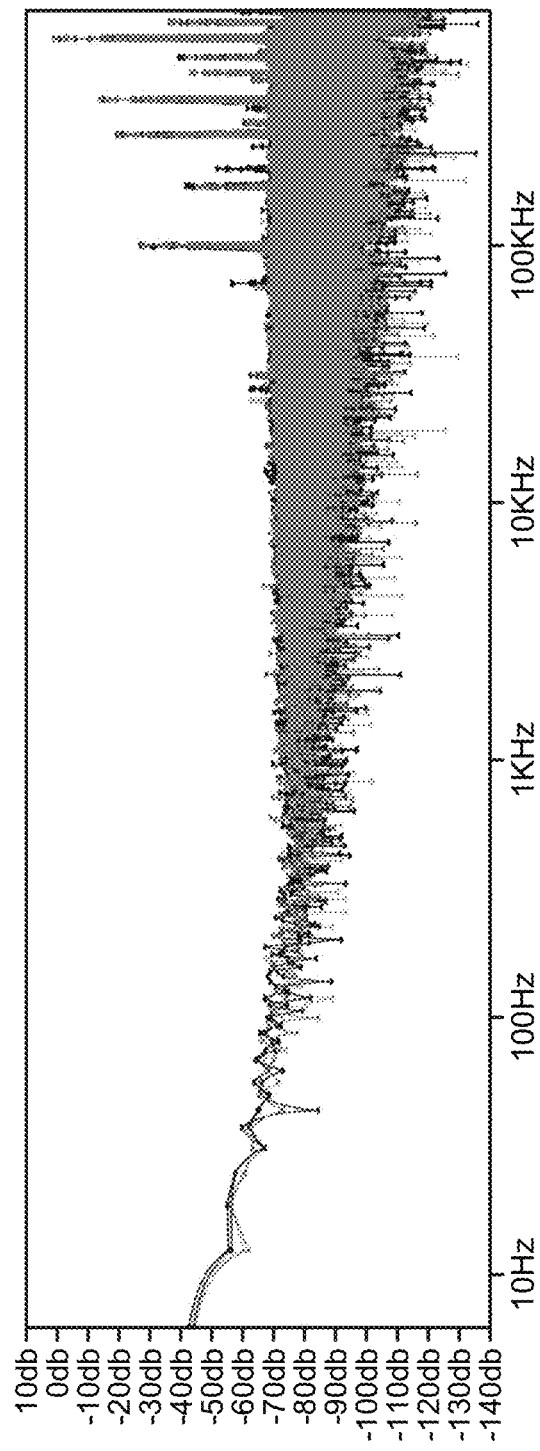
FIG. 6B is a graph depicting a crystal oscillator frequency domain results (FFT) for four temperatures.

FIG. 6 depicts crystal oscillator time and frequency results: FIG. 6A depicts superimposed time domain results for temperatures 0, 25, 50, 75 deg C. FIG. 6B depicts superimposed frequency domain results (FFT) for temperatures 0, 25, 50, 75 deg C.

Figure 7A:
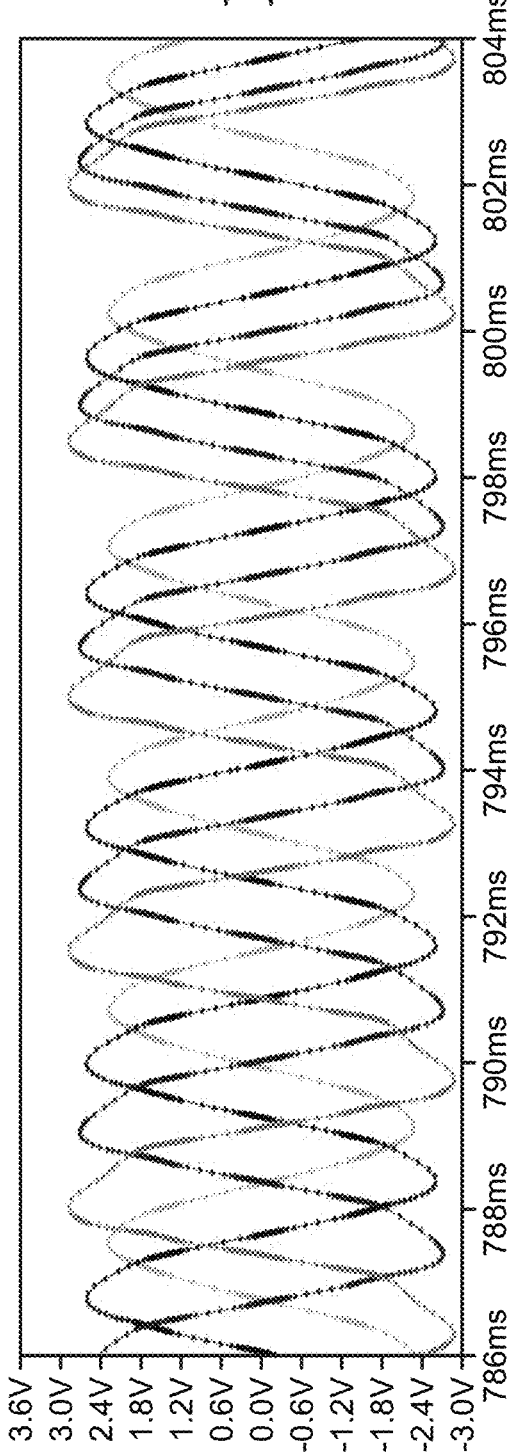
FIG. 7A is a graph depicting the oscillator time results for four temperatures in accordance with the present disclosure.
Figure 7B:
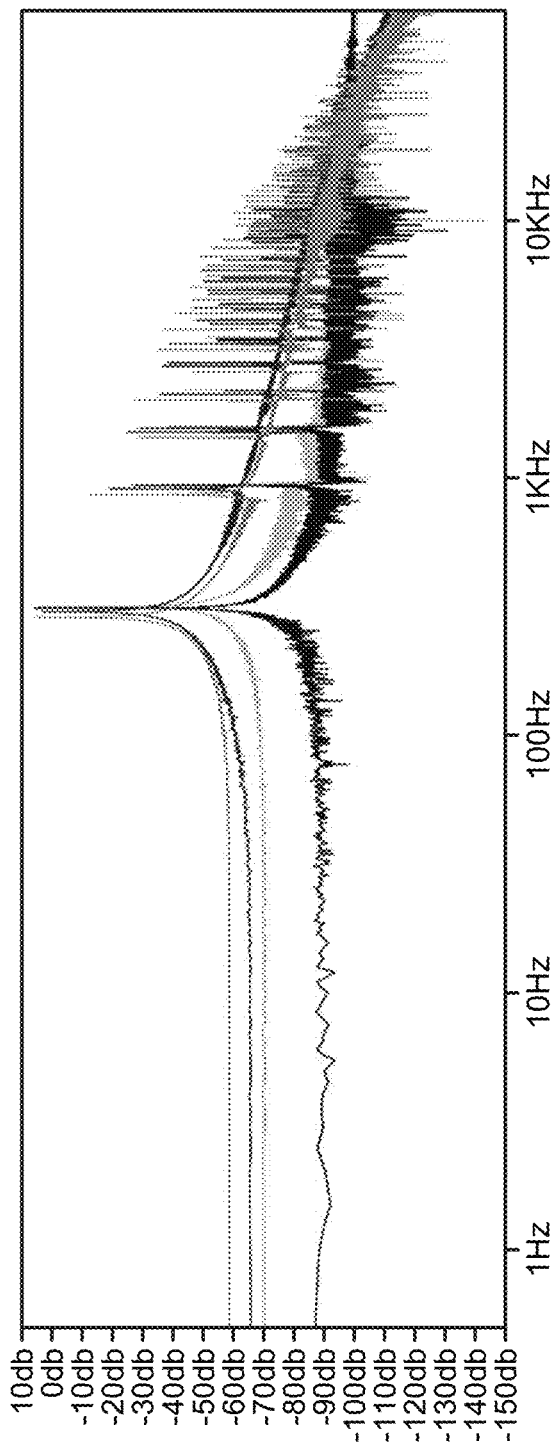
FIG. 7B is a graph depicting the oscillator frequency domain results (FFT) for four temperatures in accordance with the present disclosure.

Case A Oscillator Details: As indicated by FIG. 7A and FIG. 7B, the circuit of FIG. 3 has essentially no startup transients of note, so they are not shown. The nonlinearity, in this case, is implemented with the minimum number of transistor components possible for a device corresponding to 3 stable limit cycles. Only the middle limit cycle (oscillation) is evaluated.

FIG. 7A and FIG. 7B shows Case A oscillator time and frequency results: FIG. 7A depicts superimposed time domain results for temperatures 0, 25, 50, 75 deg C. FIG. 7B depicts superimposed frequency domain results (FFT) for temperatures 0, 25, 50, 75 deg C.

Case B Oscillator Details: As indicated by FIG. 8A and FIG. 8B, the circuit of FIG. 4 has essentially no startup transients of note, so they are not shown. The nonlinearity, in this case is implemented by utilizing OPAMP's. As compared to the circuit of FIG. 3, FIG. 4 provides for a more precise nonlinearity, F(x). This is more important when working with discrete component designs. For an actual integrated circuit implementation, this may not be the case and an approach similar to Case A may be sufficient. As in Case A, only the middle limit cycle (oscillation) is evaluated.

FIG. 8A and FIG. 8B shows Case B oscillator time and frequency results: FIG. 8A depicts Superimposed time domain results for temperatures 0, 25, 50, 75 deg C. FIG. 8B depicts superimposed frequency domain results (FFT) for temperatures 0, 25, 50, 75 deg C. Importantly, no variation with temperature is indicated. Laboratory measurements for the printed circuit board implementation of this device are also consistent with these simulation results.

Analysis

As compared with a conventional crystal oscillator, there are a few metrics that describe equivalent (or better) performance. Again, if purely electronic circuitry (alone) achieves at least equivalent performance to a crystal oscillator, then due to cost, fabrication, and miniaturization considerations the purely electronic approach is considered superior. If performance is also superior, then an even clearer outcome is evident.

The significant capabilities that govern superiority are described as follows: Electron Mobility Considerations: A prevailing argument of the use of crystals is that the purity of the crystal and the associated nano scale oscillations are purer, as compared to purely electrical ones. Roughly the argument goes that electron transport mechanisms are subject to plethora of collisions, which can result in phase distortions, as compared to the vibrations that are associated with a pure crystalline structure. For the moment, the fact that a crystal has to somehow be interconnected to an electronic circuit, that contains active elements, will be ignored. Modern theory regarding electronic conduction indicates that the prevailing transport mechanism is actually ballistic in nature. The more closely the transistor operation is to tunneling, the more likely this is the case. With respect to the proposed circuit (Case A or B), the parameter $\mu$ (see Equation 2 and Equation 4) can be made as large as desired for nonlinearities. In turn, the parameter $\mu$ is easy to increase, which also increases the likelihood of transistor operation in the tunneling regime. Hence, if Brownian motion collisions are in fact a consideration, they are easy to avoid through ballistic transport. The approach of Case A or Case B should therefore be immune to impurities which are conventionally sited to support the need for a crystal.

Limit Cycle Rate of Convergence: While circuit designers do not necessarily conventionally think in terms of phase plane characterization of oscillators, it is indeed a useful way of representation. Such a formulation significantly relies on phase plane characterizations, which is equivalent to the I-V (current-voltage) plane, for all electronic circuits. An oscillation is always represented by a closed curve in the phase plane. Invariance for an oscillation is equivalent to no discernible variation in the (dynamical) phase plane. Additionally, it is worth noting that for any oscillation, which is mathematically termed a limit cycle in the phase plane, there is an associated rate of convergence to the limit cycle (stable oscillation). As evidenced by FIG. 5, the rate of convergence to a stable (i.e., invariant) limit cycle is not very good for a conventional crystal oscillator. This also means that if this oscillation was somehow perturbed, it would take some time before it re-established itself as stable. By comparison, the circuit that is governed by a nonlinearity described by Theorem 3 (described in greater detail herein) can have an extremely fast rate of convergence. In a practical sense, the parameters $D_1$ and $D_2$ of FIG. 3 can be designed such that the rate of convergence is as fast as desired. (NOTE: In order to have a suitable $D_1$ and $D_2$, there is a need for a nonlinearity that provides for more than one limit cycle, as described by Theorem 3). In a practical sense, convergence to a stable limit cycle is instantaneous—any startup transient is on the order of 1 or 2 periods of oscillation. This means that a Case A or B oscillator will have far superior noise immunity compared to a conventional crystal oscillator (small perturbations will result in an immediate return to a stable limit cycle). If for some particular case the rate of return is not good enough, the means for improvement involve changing the design parameters: $D_1$, $D_2$ and $\mu$.

Temperature Variations: A crystal oscillator is not necessarily immune to oscillation variations as a function of temperature. It is important to note that any crystal oscillator will have a dependence on some active electronic element. Hence, a crystal oscillator temperature performance will depend upon both the thermal characteristics of the crystal, as well as the associated electronics. By comparison, a Case A or Case B oscillator will only have thermal considerations associated with electronic components. In all three types of oscillators, the most critical source of variations will be associated with the active transistor components. For the case of the crystal oscillator, the thermal variations of a crystal are inherently different than those of the associated electronics; they are fabricated from different materials. The material advantages of a homogeneous semiconductor substrate can provide a suitably designed Case A or Case B oscillator with an advantage. This has proven to be the case as demonstrated by the Case B simulations. The printed circuit board implementation, from which actual measurements that agree with the theory and simulation results were made, confirms the viability of the approach (measurements were only conducted at uncontrolled room temperature over a 14 hour period of observation).

The SPICE simulations indicate significant temperature performance advantages of the Case B oscillator. By comparison the Case A oscillator and the crystal oscillator both had no temperature compensation circuitry, and they did not compete as well with the refined OPAMP dependent design. The fact that performance was not as good for these circuits is consistent with expectations.

Rigidity of the Nonlinearity: Assuming the voltages sources are stable for all the indicated oscillators, and assuming that transport of electrons is not really a factor, then the manner in which the invariance of oscillations can be determined is by the rigidity of the associated nonlinearity which give rise to the oscillations. If the nonlinearity is invariant, then so must be the oscillations.

The significant variable of interest would be the rate of convergence to the domain of attraction for the indicated limit cycle (oscillation) which is also completely controllable. In the case of the crystal oscillator, the nonlinearity is a function of both the active elements of electronic circuit, as well as the crystal itself. Modeling the exact nature of this nonlinearity is somewhat difficult to discern. It can be measured, but the exact synthesis is crystal dependent. By comparison, the Case A and Case B oscillators have a precise nonlinearity formulation that is governed by Theorem 3 (described in greater detail herein) and the associated means for electronic synthesis. It is highly controllable and measurable. For example, if the nonlinearity is not "good enough" then it can be made better. This is not necessarily the case for a crystal oscillator. In the case of a crystal oscillator, there will always be a need to strike a balance between the crystal and the electronics in order to achieve a desired performance. This dependency is more prone to trial and error efforts. Roughly, a pure crystal has integrity due to its inherent pure crystalline structure. What the proposed electronic structure may lack in purity, it makes up for with well-controlled feedback that causes impressive rates of convergence to highly constrained zones of attraction. These highly controlled zones of attraction are what assure a highly invariant resultant oscillation (limit cycle). For these reasons, a Case A or Case B oscillator is likely to be superior.

Results

Conventional wisdom seems to be hooked on the concept that a purely electronic oscillation cannot be as reliable as one that is based on a crystal oscillator. These results indicate that this is not the case. For this analysis, relative comparisons are being made. This is more important and informative than absolute numbers, as absolute numbers are clearly going to depend on the circumstances. Relatively speaking, the Case B oscillator, which is purely electronic (no crystals) performed best. Best is again relative. It is clear that Case B has no startup transients, and the crystal oscillator has some significant startup transients. In the steady state, both the crystal and the Case B oscillators behaved similarly. If the phase shifts were removed from FIG. 6A, then there would be a high degree of overlap between the 4 temperature cases. However, FIG. 8 shows virtually zero variation across temperature and there are no annoying startup transients. Referring to the frequency spectrum's in FIG. 6B and FIG. 8B, the Case B results show essentially no variation in temperature and virtually a single frequency that dominates. The crystal oscillator is not quite as good. Careful examination of the crystal oscillator waveforms indicates less consistency in shape and amplitude as compared to the Case B oscillator, which is essentially invariant.

The fact that the Case A results indicate more variation with temperature is not really a surprise. All the circuits have a dependency on transistor elements. The design in Case B is a more refined one, based on operational amplifiers that have been the subject of continual improvements. The stated manufacturer specifications indicate virtually no performance variation across the indicated temperature range and the simulation results confirm this. Both Case A and the crystal oscillator depend upon uncompensated transistor variations. In the crystal oscillator there is only one transistor. In Case A, there are many transistors. However, even the Case A variations are not that bad. They do not demonstrate a competitive oscillator, but they are still moderately respectable. If this design was implemented as a semiconductor device, as compared to one with discrete components (individual component transistors), then there would likely be available means to minimize temperature variations and still rely on fewer transistors.

The point is that a very stable nonlinearity of the sort described in FIG. 2(e) represents what can be considered as a synthetic crystal, only better than a conventional one. It is clear that if F(x) is invariant, then so must be the associated oscillations. It has been pointed out that the purity of a crystal will give rise to less Brownian motion types of collisions associated with electron mobility than what is found in a semiconductor substrate. This is not necessarily the case. For example, if the primary "flow" of electrons in the semiconductor is due to tunneling, then the action is a ballistic one for which there is essentially no electronic charge motion. Hence, the purity of the crystal is not likely to be a factor, by comparison. These simulation results would tend to illustrate this point, assuming the fidelity of the manufacturers models are good enough (which is likely). The SPICE program utilized was supplied by LT SPICE and the operational amplifier SPICE model was also provided by LT (now Analog Devices). For the Case B oscillator, even though the induced temperature effects are small they are apparent in the simulation, with careful inspection.

Additionally, both the Case A and Case B circuits were synthesized with actual (commercial) components. Measurements made, especially for Case B, where in virtual absolute agreement with those of the simulation. Only a 40 MHz oscilloscope was available for making measurements regarding the period and amplitude of the resultant oscillations. In over 14 hours of continuous operations, there was zero variation in the observed period of oscillation, within the resolution of the oscilloscope. This is consistent with the simulation results as well.

An approach to realize a precise periodic oscillation has been described, simulated and fabricated. The proof of the theory that further validates these results described in greater detail herein. It is indeed possible to develop a completely electronic solution (no crystals) that performs as well, or better, than a crystal oscillator. Comparative detailed simulations have been provided. SPICE simulations are known to be very accurate and measurements on an actual fabricated device confirm this. A synthetic crystal oscillator, with an F(x) nonlinearity of a particular form has been developed. The next steps of this research will hopefully include reducing the proposed oscillator to an integrated circuit. In this manner the true value of what has been formulated and confirmed will also be demonstrated as compact semiconductor device.

Topological Considerations

The present disclosure provides a device that is useful in representing systems or objects that are defined in what can equivalently be thought of as four dimensions, time and space, or more formally as a Minkowski Space.

Theorem 1: For an invariant dynamical system in a Minkowski Space, a fixed symmetric pattern is represented by no more than two complex planes (manifolds), $C^2$.

Proof: The Cayley-Dickson formulation assures that it is possible to successively create sequences of Algebras, such that the next is twice the dimensionality of the previous one. For the present disclosure, it is assumed that all that is "recognized" is defined by Minkowski Space, which is a fourth-order space covered by Cayley-Dickson and generally attributed to Hamilton. It is, therefore, possible to show that for the generalized quaternion $$q = w + x\,i + yj + zk$$

where i, j, k are mutually perpendicular bivectors, which satisfy the relationship $i^2 = j^2 = k^2 = ijk = -1$, and w, x, y, z$\in$R, then $$q \equiv (w + x\,i) + (y + zi)j$$

represents two independent manifolds in $C^2$, which are sufficient to represent the space.

Next, it is recognized that by choosing the two complex planes to be orthogonal, with one of them perpendicular to the time-varying flow of the system, then only one manifold in $C^2$ is sufficient to represent a system that is stationary.

Finally, since according to the Noether Theorem, then it can be assured that a suitably conservative system will give rise to a stable symmetric pattern in the indicated plane(s).

Multiple Invariant Stability Zone Devices

For simplicity, it will be assumed that the periodic signals of interest are representable in the complex plane $C^n$, where n=2.

If the signal of interest, s(t), is periodic and is representable in the phase plane $C^2$, then one can imagine that it must correspond to a closed orbit. Since more typically, s(t)=f(t)+η(t) where f(t) is the actual signal with additive noise, η(t), it is important to consider that for practical situations, s(t) will have a noise component that will not detract from its ability to remain periodic.

The classical nonlinear system, especially with respect to dynamics on a particular manifold of interest is the subject of various well-established works. The "dot" operator indicates a derivative with respect to an independent parameter of time for the classical nonlinear system $$\dot{x} = f(x).$$

In general, x$\in$$R^n$. It is often convenient to represent planar systems, where n=2, as $$\dot{x} = P(x,y); \dot{y} = Q(x,y). \quad \text{(Equation 1)}$$

In some cases, the general nonlinear system can be parameterized to be dependent upon a scalar quantity, μER, which can be thought of as $$\dot{x} = f(x, \mu) \quad \text{(Equation 2)}$$

and the parameter μ is a so-called bifurcational parameter; very often as this parameter is allowed to vary, the phase-portrait, or else the generalized solutions of the systems of equations, $\varphi_t$, take on qualitatively different topologies depending upon this parameter.

With this in mind, the class of systems under consideration is described as Lienard Systems of the form $$\dot{x} = P(x,y) = y - F(x); \dot{y} = Q(x,y) = -g(x). \quad \text{(Equation 3)}$$

The following parameters will also be of use:

$$\mu F(x) = \int_0^x \mu f(s)\,ds;\ G(x) = \int_0^x g(s)\,ds \quad \text{(Equation 4)}$$

where it is well understood that (Equation 3) is equivalent to the autonomous system $$\ddot{x} + \mu f(x)\dot{x} - g(x) = 0. \quad \text{(Equation 5)}$$

One of the best known examples of such a system is the van der Pol Oscillator, which is a particular version of a Lienard system $$\ddot{x} + \mu(x^2 - 1)\dot{x} + x = 0. \quad \text{(Equation 6)}$$

Equation (6) is known to give rise to a single limit cycle (oscillation), which is characterized by a closed continuous curve in the phase plane. As the parameter μ→0, the limit cycle becomes more and more circular, as compared with the so-called relaxational oscillations that occur when μ→∞.

For convenience, a limit cycle associated with a generic nonlinear oscillator will be defined by the symbol $\lceil$ where the time-varying nature of the limit cycle is implicitly assumed, as such a limit cycle is periodic by definition. The associated planar flows for such a nonlinear oscillator are represented by $\varphi_t(x_0)$, where $x_0 = (x_0, y_0)$ are the associated planar initial conditions. The time-varying nature of the flow is explicitly indicated, as unlike the limit cycle, $\lceil$, the nature of the flow will depend upon the initial conditions. For simplicity initially, the possibility of multiple different limit cycles is neglected.

The limit cycle, $\lceil$, for (Equation 6) is centered with respect to the origin that is termed a center. The planar flows associated with the initial conditions $x_0 = (x_0, y_0)$ are such that $|x_0| = \lceil^- < |\lceil|$. So that $\varphi_t(x_0)$ will evolve over time to a steady state limit cycle such that $|\lceil| = 2$ (for sufficiently small μ). We only assume sufficiently small μ, but the same is true for larger μ under suitable circumstances. Similarly, for initial conditions outside of these steady-state conditions, $\lceil$, the associated planar flow when $|x_0| = \lceil^+ < |\lceil|$, $\varphi_t(x_0)$ will end up in the same steady-state oscillation, $\lceil$. As the parameter μ is increased, the shape of the oscillations will become less and less sinusoidal, which means that $|\lceil| = K(t) \neq 2$, where K(t) represents the time varying nature of the magnitude $|\lceil|$ resulting for μ$\gg$0. While the nature of (Equation 6) looks disarmingly simple, the nature of the solutions is particularly rich. It is important to indicate that not all variations of (Equation 3) will give rise to steady-state stable oscillations. This means that certain conditions on F(x) (or equivalently f(x)) and G(x) [or equivalently g(x)] will be the primary means by which the character of the phase plane portrait will be determined.

A particular interest is the occurrence of more than one limit cycle associated with the system (Equation 3).

In this regard, citing a particular Theorem (i.e., Theorem 2, below) is useful for illuminating the character of these limit cycles for small parameter μ (realizing that (Equation 2), which is dependent upon μ can be subsumed in (Equation 3) and, therefore, takes on the following proof.

Theorem 2: For $\in \neq 0$ sufficiently small, the Lienard system (Equation 3) with g(x)=x and $F(x) = \in [a_1 x + a_2 x^2 + \ldots = a_{2m+1} x^{2m+1}]$ has at most m limit cycles; furthermore, for $\in \neq 0$ sufficiently small, this system has exactly m hyperbolic limit cycles that are symptopic to the circles of radius $r_j$ where j=1, ..., m, centered at the origin as $\in \to 0$ iff the mth degree equation $$\frac{a_1}{2} + \frac{3a_3}{8}\rho + \frac{5a_5}{16}\rho^2 + \ldots + \left(\frac{2m+2}{m+1}\right)\frac{a_{2m+1}}{2^{2m+2}}\rho^m = 0$$

has m positive roots $\rho = r_j^2$, j=1, ..., m.

In addition, it is important to note that the "center" at the origin when associated with more than one hyperbolic limit cycle can either be stable or unstable depending upon the number of roots of the equation in Theorem 2. Also, as a result of Green's Theorem on the plane, the "nested" limit cycles (when there is more than one) must alternatively be stable and unstable, with the unstable ones serving as separatrices for the domains of attraction for the stable ones. Finally, Theorem 2 addresses the situation of a small parameter variation from a linear case. In the event that $\rho \to \infty$, it is necessary to resort to other means to determine the nature of the associated limit cycles. The nonlinearities presented in this work are also valid for large p.

Figure 9A:
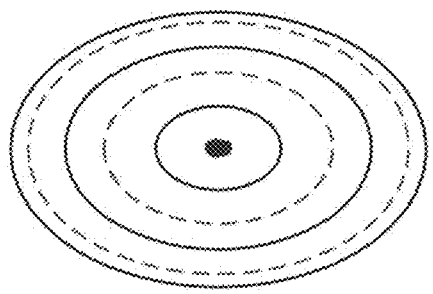
FIG. 9A is a schematic representation of a phase plane portrait and the associated partitioning of stable (solid) and unstable (dashed) limit cycles of the phase plane.
Figure 9B:
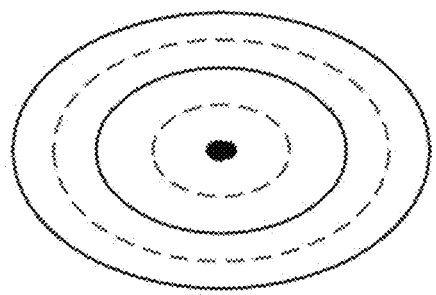
FIG. 9B shows an Nth order (versus N+1) partitioning of the phase space in a complimentary manner.

FIG. 9A depicts a N+1 order phase plane portrait and the associated partitioning of stable (solid) and unstable (dashed) limit cycles of the phase plane. FIG. 9B Nth order (versus N+1) partitioning of the phase space in a complementary manner.

Figure 10A:
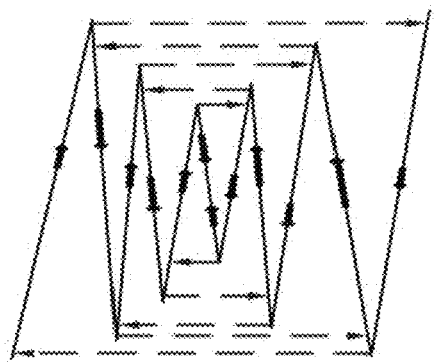
FIG. 10A is a schematic representation of an automaton generating nonlinearities corresponding to FIG. 9A.
Figure 10B:
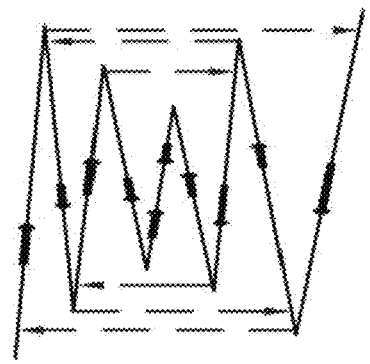
FIG. 10B is a schematic representation of an automaton generating nonlinearities corresponding to FIG. 9B.

FIGS. 10A and 10B represent the nonlinearities that correspond to FIGS. 9A and 9B respectively. The superimposed flows illustrate the approximate location of limit cycles for $\mu \gg 1$ in (Equation 3) (nonlinearity is only the solid portion of the curve, which is represented in the phase plane, as in the case in FIG. 9).

Based on Theorem 2, it is, therefore, completely reasonable to expect to partition the phase plane as shown in FIG. 9. As p increases and the associated oscillations become more and more relaxational, the character of the limit cycles will adhere more closely to the dotted lines. FIG. 10 illustrates the interdependence of the nonlinearity F(x) and the associated limit cycles for an actual device for intermediate $\mu$.

Figure 11:
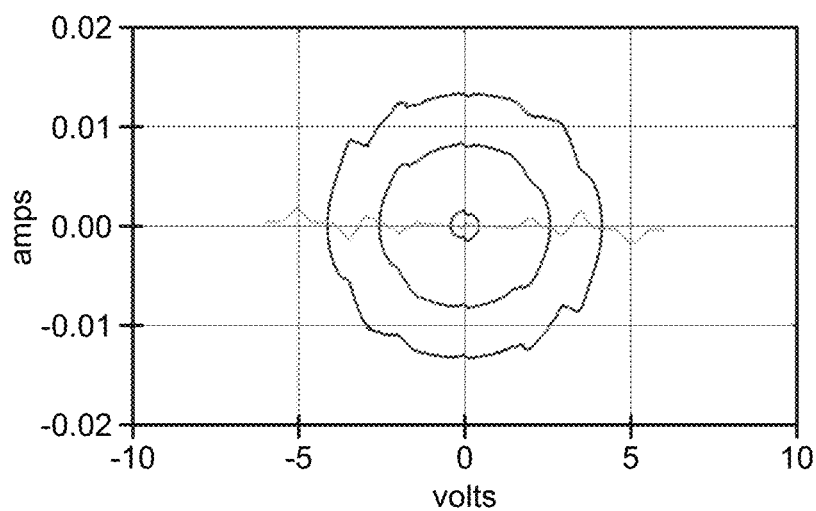
FIG. 11 is a graph depicting the superimposed nonlinearity of FIG. 2E with the resultant three stable limit cycles.

Based on Theorem 2, it is, therefore, completely reasonable to expect to partition the phase plane as shown in FIG. 9. As $\mu$ increases and the associated oscillations become more and more relaxational, the character of the limit cycles will adhere more closely to the dotted lines indicated in FIG. 10. FIG. 11 illustrates the interdependence of the nonlinearity F(x) and the associated limit cycles for an actual device for intermediate $\mu$.

FIG. 11 depicts a phase plane with superimposed characteristic, F(x), for FIG. 2C with N=6, based on the nonlinearity in FIG. 2A—the profile of voltages is as follows (volts): $V_1$=3.0, $V_2$=5.5, $V_3$=1.0, $V_4$=4.0, $V_5$=0.5, $V_6$=2.0; L=800 mH, and C=5$\mu$ f. The set of resistors is not shown (for simplicity). FIG. 2C is VQWMO nonlinearity, F(x), topological structure. FIG. 2A is nonlinear Elements for each Branch in FIG. 2C. Here the FET is 2N4338 type and the bipolar junction transistor (BJT) is a type 2N2905A. The resistor values are somewhat variable per stage but typically in the 50K ohm range.

Physical Device Realization—Virtual Quantum Well Multistable Oscillator

The device realization is based on the superposition of multiple negative resistance elements, which are, in turn, combined in parallel (for the case of voltage controlled devices). The result is termed a VQWMO as illustrated in FIG. 2C.

Applying the transmission line equivalent solutions to the Schroedinger Equation and the I-V descriptions suggested in FIGS. 2, 10, and 11, what follows represents a discrete component realization of a quantum well multi-state oscillator.

The salient feature of (Equation 3), F(x), is realized by the one-port in FIG. 2C. Such a structure can be made to function with discrete components, and other implementations are feasible as well. This structure includes pairs of identical branches, except for polarity. The representative topological structure of the nonlinear $R'_i s$ in FIG. 2C is shown in FIG. 2A. When this structure is combined with suitable inductance and capacitance as illustrated in FIG. 2, this will result in a VQWMO.

Figure 12A:
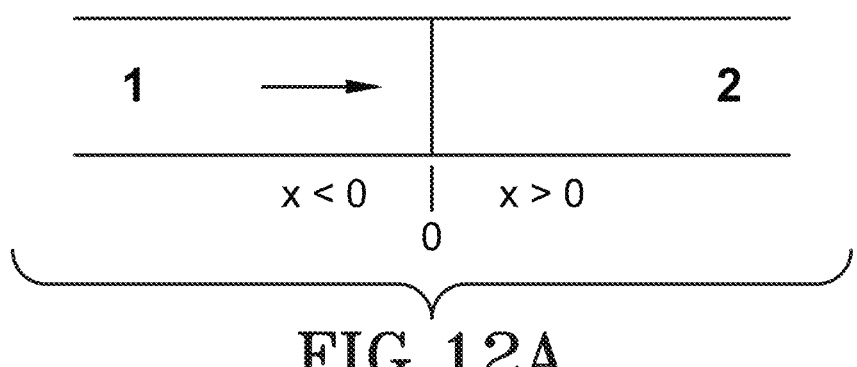
FIG. 12A is a schematic representation of an infinite source of electrons impinging on a generalized boundary.
Figure 12B:
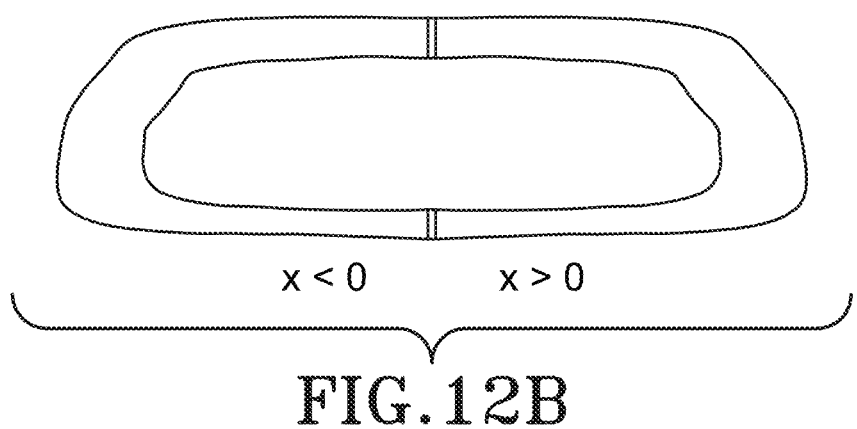
FIG. 12B schematically represents the manner in which the electrons of FIG. 12A are contained.

Assuming a clockwise flow of electrons based on a superposition of multiple 1-D components that comprise the multiple nonlinear resistors in FIG. 2C, one can imagine a model that conforms to FIG. 12A and FIG. 12B associated with the multiple limit cycles previously characterized in FIGS. 9 and 10, which are guaranteed by the associated mathematical formulations of the previous section. Where FIG. 12A depicts infinite source of electrons impinging on a generalized boundary, which may be "transparent." FIG. 12B depicts a manner in which such electrons are "contained."

The device of FIG. 2 is consistent with the indicated solution to the indicated transmission line formulation of the Schroedinger Equation.

An exemplary advantageous feature of a VQWMO is the nonlinearity, F(x) [or equivalently f(x)] of (Equation 3). FIG. 11 shows what the combination of superimposing FIGS. 5 and 6 looks like for the particular, F(x), for FIG. 2.

Theorem 3 and Proof

Lemma (Weierstrass Approximation Theorem): Suppose F is a continuous real-valued function defined on the real interval [a, b]. For every $\in$>0, there exists a polynomial p(x) such that for all x in [a, b], there is |F(x)−p(x)|<$\in$, or equivalently, the supremum norm ||F−p||<$\in$.

The fundamental theorem of Algebra indicates that a polynomial of degree "n" necessarily has "n" roots, some of which may be degenerate. In addition, it is well known that a polynomial can be realized by factoring it in terms of its roots. We will use this to show that for a given PWL function, f(x), a suitable polynomial approximation exists.

Lemma (Brayton-Moser Theorem): Consider a standard electrical network (the complete details of the term "standard" are omitted for simplicity, but may be better understood by reference to standard texts on circuit theory) of components that are interconnected in a manner that can be defined by a graph G, which is comprised of directed branch currents $i_k$, and nodal voltages $v_k$ where k indicates the $k^{th}$ branch or node, respectively. Therefore, the set of branch currents for the network can be denoted as the vector i and similarly nodal voltages are represented by vector v. Hence, the network power, P, can be denoted by the scalar product P=(v, i).

Recognizing that the generalized network includes nonlinear, possibly time-varying inductors, capacitors, and resistors (to include negative resistance as well), the following definitions are necessary to interpret the final result. Note that further details regarding the exact means to construct the so-called mixed potential function Q will be omitted for simplicity.

Hence, a differential relationship for the scalar P can be defined as $$dP=dG+dJ$$

where $$dG=(i,dv), dJ=(v,di).$$

For completeness, it is useful to recognize that the set of network capacitors and inductors gives rise to matrices C and L, which are derived from associated graph theory consistent with the vectors v and i. Furthermore, it is important to note that, in general all elements of the state of the system will be time varying $$i = C(v)\frac{dv}{dt}, v = L(i)\frac{di}{dt}$$

Next, it is noted that the state space is governed by a manifold $\Sigma \subset \mathbb{R}^2 \times \mathbb{R}^2$ that is reduced from a dimension of 3 as a consequence of the fact that the following main results of the Barton-Moser Theorem:

$$\psi = (v^i) : Q(\psi) = (_0^{L(i)} {}_{-C(v)}^{0})$$

hence $$Q(\psi)\frac{d\psi}{dt} = \frac{\partial Q(\psi)}{\partial \psi}.$$

The integral of any curvilinear curve in the state space (phase plane) for each of the quantities dG and dJ is zero. While the system is dissipative, if the time varying nature of the system is not constant, then it must be periodic, assuming it is stable (and invariant). If the state of the system as determined by i and v is periodic, so must be the mixed potential function Q(i, v). But since Q is a measure of "power," then its integral over a curvilinear curve must be zero (indicating something is consuming energy and something is supplying energy in a compensating manner).

These observations are valid for whatever nonlinear resistor may exist in the network. This is determinable by relying solely on the inductor and capacitor states. It is valid even if for non-constant inductors and capacitors.

Details of constructing mixed potential functions Q are consistent with standard circuit analysis methods associated with Kirchoff voltage-current relationships, but they require systematic procedures that are specific network dependent. In general, simplified examples are not widely seen.

A system that is described by Equation 3, which contains continuously differentiable F(x), and g(x)=x, will always give rise to exactly $$\Omega = \frac{n-1}{2}$$

limit cycles, $\int_p$, $\{F_p | p=1, 2, \ldots, ((n-1)/2)\}$, when F(x) is described as follows: (1) for a given continuously differentiable F(x) with $\{m_j | j=0, 1, 2, \ldots, n \in O\}$, we require that $\{0 < m_j < \infty | j \in E\}$ (including 0) have strictly positive slope and $\{-\infty < mj << 0 | j \in O\}$ have strictly negative slope. (2) F(x) will have strictly n real roots, with one real root between each break points (see Lemmas in [116]). (3) F(x) will be odd-symmetric F(x)=-F(-x) $[-\infty < x < \infty]$. (4) The set of non-zero extremes points for |F(x)| will be described by a strictly monotonic increasing function, $x \in R$. (5) $F(x) \rightarrow \pm\infty$ as $x \rightarrow \pm\infty$.

Additional Lemmas and consideration are detailed in a Journal Article entitled "FORCED 2-D ENERGY TRANSITIONS SUITABLE FOR HIGH POWER APPLICATIONS" published in July 2019 by IEEE TRANSACTIONS ON PLASMA SCIENCE, Vol. 47 at 3228; the entirety of which is incorporated by reference as if fully rewritten herein.

Figure 13:
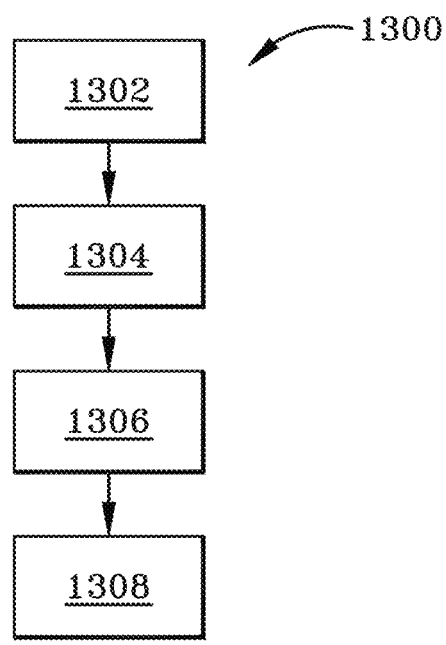
FIG. 13 is a flow chart depicting an exemplary method in accordance with one aspect of the present disclosure.

FIG. 13 depicts an exemplary method in accordance with one aspect of the present disclosure generally at 1300. Method 1300 includes creating a particular nonlinearity based on a voltage or current in an integrated circuit, which is shown generally at 1302. Method 1300 includes generating nonlinearity for feedback in response to the voltage or current, which is shown generally at 1304. Method 1300 includes generating multiple stable oscillations or limit cycles based on the nonlinear feedback, which is shown generally at 1306. Method 1300 includes connecting at least one of the stable oscillations or limit cycles to a timing circuit for precision time measurement in a digital device that electronically simulates or emulates a crystal oscillator, which is shown generally at 1308.

Additionally, method 1300 may include synchronizing the digital device with a second digital device based on the timing circuit connected to the at least one stable oscillation or limit cycle. In this instance, the electrical circuit free from any connection a crystalline structure. Further, method 1300 may include generating at least three oscillations or limit cycles based on the nonlinear feedback. In this instance, the at least three oscillations or limit cycles are concentric.

In one embodiment of method 1300, the at least three oscillations or limit cycles include an inner, a middle, and an outer stable oscillation or limit cycle, further comprising: bounding the middle stable oscillation or limit cycle between the inner and outer stable oscillations or limit cycles.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a nonlimiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a nonlimiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. An integrated circuit synthetic oscillator comprising:
   an electrical circuit comprising a current source defining a current controlled nonlinear circuit;
   wherein a plurality of stable oscillations are generated by the current controlled nonlinear circuit,
   wherein the stable oscillations have a nonlinear feedback,
   wherein the stable oscillations comprise a stable inner oscillation, a stable middle oscillation, and a stable outer oscillation, and
   wherein at least one of the stable oscillations is employed in a timing circuit for precision measurement in a digital device without a crystalline structure coupled to the electrical circuit.

2. The integrated circuit synthetic oscillator of claim 1, wherein the nonlinear feedback is a nonlinearity having at least 5 distinct regions with a negative slope adapted to correspond an electrically powered event that results in at least three stable oscillations.

3. The integrated circuit synthetic oscillator of claim 2, wherein the current source generates the at least 5 distinct regions.

4. The integrated circuit synthetic oscillator of claim 1, wherein the stable middle oscillation is bound between the stable inner and the stable outer oscillations.

5. The integrated circuit synthetic oscillator of claim 1, further comprising:
   at least two transistors in the electrical circuit carried that generate a negative resistance in response to the voltage applied to the electrical circuit, wherein the nonlinear feedback is based, at least in part, on the negative resistance.

6. The integrated circuit synthetic oscillator of claim 1, wherein the middle stable oscillation is provided to the digital device.

7. The integrated circuit synthetic oscillator of claim 1, further comprising a plurality of unstable oscillations.

8. A method comprising:
   creating a purely electronic oscillator having a complex nonlinear feedback based on a voltage or current in an integrated circuit;
   generating the complex nonlinear feedback in response to the voltage or current;
   generating at least three concentric stable oscillations or limit cycles based on the nonlinear feedback;
   connecting at least one of the stable oscillations or limit cycles to a timing circuit for precision time measurement in a digital device without any connection to a crystalline structure; and
   wherein the stable oscillations or limit cycles are based on the complex nonlinear feedback, wherein the complex nonlinear feedback is generated by a complex nonlinear equation that generates more than one limit cycle.

9. The method of claim 8, further comprising:
synchronizing the digital device with a second digital device based on the timing circuit connected to the at least one stable oscillation or limit cycle.

10. The method of claim 8, wherein the at least three oscillations or limit cycles include an inner, a middle, and an outer stable oscillation or limit cycle, further comprising:
bounding the middle stable oscillation or limit cycle between the inner and outer stable oscillations or limit cycles.

11. An integrated circuit synthetic oscillator comprising:
an electrical circuit comprising a voltage source defining a voltage controlled nonlinear circuit;
wherein a plurality of stable oscillations are generated by the voltage controlled nonlinear circuit,
wherein the stable oscillations have a nonlinear feedback
wherein the stable oscillations comprise a stable inner oscillation, a stable middle oscillation, and a stable outer oscillation; and
wherein at least one of the stable oscillations is employed in a timing circuit for precision measurement in a digital device without a crystalline structure coupled to the electrical circuit.

12. The integrated circuit synthetic oscillator of claim 11, wherein the stable middle oscillation is bound between the stable inner oscillation and the stable outer oscillation.

13. The integrated circuit synthetic oscillator of claim 11, wherein the nonlinear feedback is a nonlinearity having at least five distinct regions with a negative slope adapted to correspond an electrically powered event that results in at least three stable oscillations.

* * * * *